United States Patent
Yew et al.

[11] Patent Number: 6,150,251
[45] Date of Patent: Nov. 21, 2000

[54] METHOD OF FABRICATING GATE

[75] Inventors: Tri-Rung Yew, Hsinchu Hsien; Water Lur, Taipei, both of Taiwan

[73] Assignee: United Microelectronics Corp, Taiwan

[21] Appl. No.: 09/235,660

[22] Filed: Jan. 22, 1999

[51] Int. Cl.[7] ............................................... H01L 21/4763
[52] U.S. Cl. ............................................................ 438/592
[58] Field of Search ................................ 438/591, 592,
438/199, 287, 308; 257/413

[56] References Cited

U.S. PATENT DOCUMENTS

| 5,652,156 | 7/1997 | Liao et al. ............................... 438/199 |
| 5,710,454 | 1/1998 | Wu ........................................... 257/413 |
| 5,723,356 | 3/1998 | Tsukamoto ............................... 438/592 |
| 5,930,612 | 7/1999 | Ito ........................................... 438/199 |

*Primary Examiner*—David Nelms
*Assistant Examiner*—Dung Anh Le
*Attorney, Agent, or Firm*—Blakely Sokoloff Taylor & Zafman

[57] ABSTRACT

A method for fabricating a gate. A gate oxide layer is formed on a substrate. A first doped polysilicon layer is formed on the gate oxide layer. A second doped polysilicon layer on the first doped polysilicon layer. A third doped polysilicon layer over the second doped polysilicon layer. The second doped polysilicon layer has a grain size larger than a grain size of both the first doped polysilicon layer and the third dope polysilicon layer.

15 Claims, 1 Drawing Sheet

METHOD OF FABRICATING GATE

BACKGROUND OF THE INVENTION

1. Field of the Invention

The present invention relates to a semiconductor fabricating method. More particularly, the present invention relates to a method of forming a gate.

2. Description of the Related Art

Because a conventional gate is made of polysilicon with a large grain size, the surface of the gate is rough. The rough surface of the gate causes scattering of a deep ultra violet ray. The scattering of a deep ultra violet ray causes difficulty in controlling a critical dimension (CD) of the gate. Therefore, the uniform critical dimension of gate is rarely achieved.

Another problem that occurs in the conventional gate is a channeling effect. That is, boron ions in the gate easily gather at a boundary between the gate and the gate oxide layer. Once the amount of gathered boron reaches a specific number, boron ions easily penetrate into the gate oxide layer. The device failure is occurred when the boron ions penetrate into the gate oxide layer.

SUMMARY OF THE INVENTION

The invention provides a method of fabricating a gate. A gate oxide layer on a substrate. A first amorphous silicon layer, a polysilicon layer, and a second amorphous silicon layer are formed in sequence over the substrate to form a sandwich structure. The sandwich structure comprises the first amorphous silicon layer, the polysilicon layer, and the second amorphous silicon layer. The sandwich structure is patterned to form a gate.

The invention forms a sandwich structure comprising a first amorphous silicon layer, a polysilicon layer, and a second amorphous silicon layer. Because surface of the uppermost amorphous silicon layer of the sandwich structure is smooth, the critical dimension can be preferably controlled and the uniform critical dimension of a gate can be obtained. In addition, after a thermal step, the sandwich structure transform into a gate structure comprising a polysilicon layer with a small grain size, a polysilicon layer with a large grain size, and a polysilicon layer with a small grain size. Thus, in the invention, the gate provides small grains to increase the boundary between the polysilicon layer and the gate oxide layer. With an increased boundary, the boron penetration to gate oxide layer is effectively reduced.

In addition, the present invention also provides another method of fabricating a gate. A gate oxide layer is formed on a substrate. A first doped polysilicon layer is formed on the gate oxide layer. A second doped polysilicon layer on the first doped polysilicon layer. A third doped polysilicon layer over the second polysilicon layer. The second doped polysilicon layer has a grain size larger than a grain size of both the first doped polysilicon layer and the third dope polysilicon layer. The above-described advantages are also included in the gate formed by this method.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
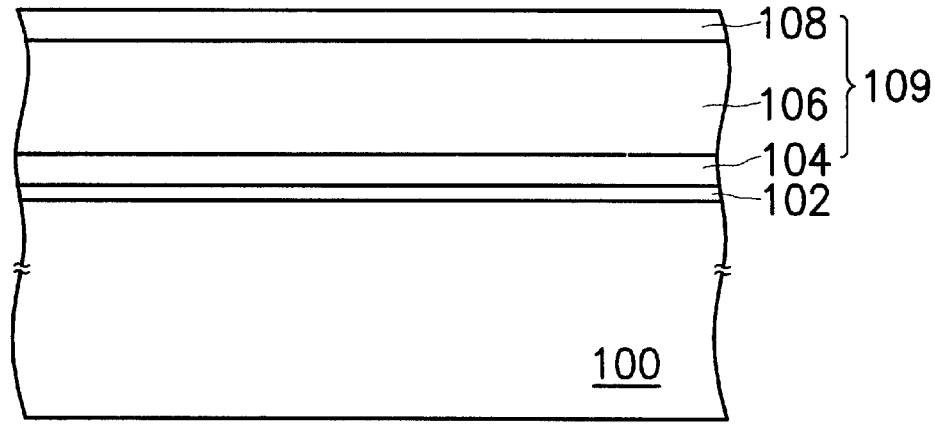
FIGS. 1A through 1C are schematic, cross-sectional views showing a fabrication method of a gate according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
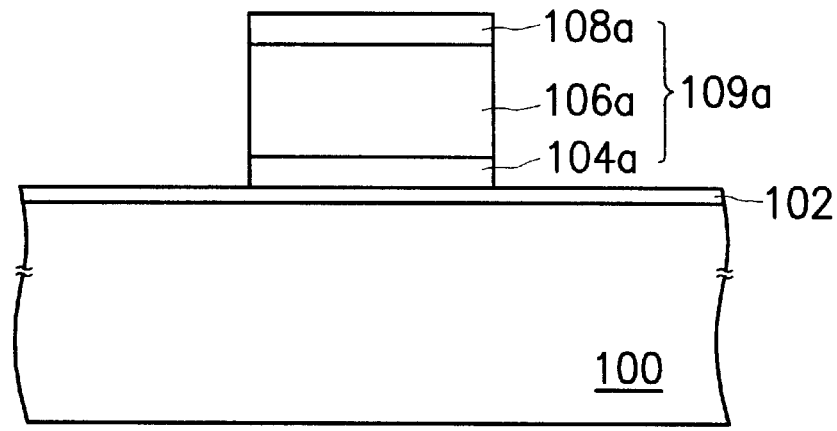
Figure 1C:
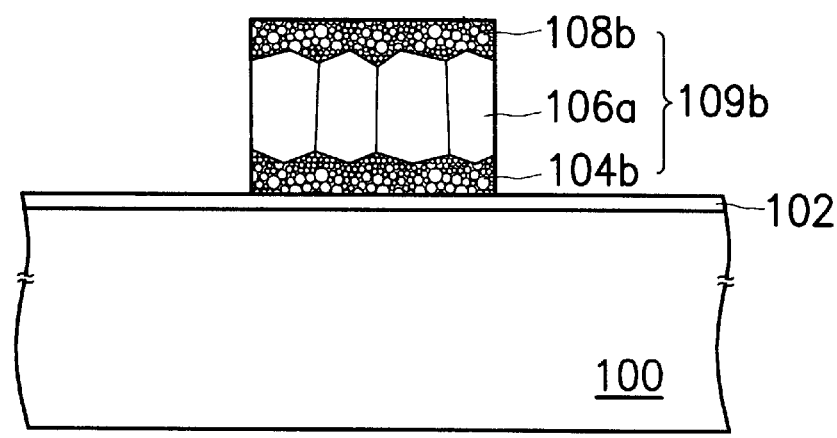

FIGS. 1A through 1C are schematic, cross-sectional views showing a fabrication method of a gate according to one preferred embodiment of the invention.

In FIG. 1, a substrate 100 is provided. The substrate 100 preferably is a semiconductor substrate, such as a silicon substrate. A gate oxide layer 102 is formed on the substrate 100. A first thin amorphous silicon layer 104 is formed on the gate oxide layer 102. Or, in stead of forming the first thin amorphous silicon layer 104, a first polysilicon layer with a small grain size 104 is formed on the gate oxide layer 102. The thickness and the forming step of the first polysilicon layer with small grain size 104 is the same as the first thin amorphous silicon layer 104 described below. The thickness of the first thin amorphous silicon layer 104 preferably is about 50 Å to 300 Å. The first thin amorphous silicon layer 104 can be formed by, for example, low-pressure chemical vapor deposition (LPCVD) at a temperature of about 500° C. to 600° C., plasma-enhanced chemical vapor deposition (PECVD) at a temperature of about 200° C. to 300° C., or other suitable deposition steps. A thick polysilicon layer 106 is formed on the first thin amorphous silicon layer 104, or on the first polysilicon layer with small grain size 104. The thickness of the thick polysilicon layer 106 preferably is about 500 Å to 3000 Å. The thick polysilicon layer 106 can be formed by, for example, low-pressure chemical vapor deposition (LPCVD) at a temperature of about 575° C. to 650° C., plasma-enhanced chemical vapor deposition (PECVD), or other suitable deposition steps. A second thin amorphous silicon layer 108 with a grain size is formed on the thick polysilicon layer 106. Or, in stead of forming the second thin amorphous silicon layer 108, a second polysilicon layer with a small grain size 108 is formed on the thick polysilicon layer 106. The thickness and the forming step of the second polysilicon layer with small grain size 108 is the same as the second thin amorphous silicon layer 108 described below. The step of forming the second thin amorphous silicon layer 108 is the same as the above-described step of forming the first thin amorphous silicon layer 104. That is, the second thin amorphous silicon layer 108 can be formed by, for example, low-pressure chemical vapor deposition (LPCVD) at a temperature of about 500° C. to 600° C., plasma-enhanced chemical vapor deposition (PECVD) at a temperature of about 200° C. to 300° C., or other suitable deposition steps. A sandwich structure 109 comprising the first amorphous silicon layer 104, the polysilicon layer 106, and the second amorphous silicon layer 108, or the first polysilicon layer with a small grain size 104, the polysilicon layer 106, and the second polysilicon layer with small grain size 108, is formed on the gate oxide layer 102.

Specifically, the sandwich structure 109 can be formed by a single performance of low-pressure chemical vapor deposition or single performance of plasma-enhanced chemical vapor deposition. In a single deposition step, the sandwich structure 109 can be formed by adjusting process parameters, such as temperature, of a deposition chamber to form each layer of the sandwich structure 109. Thus, it is not necessary to move the substrate 100 from chamber to chamber when depositing each layer of the sandwich structure 109. The sandwich structure 109 can be completed in a single chamber. Additionally, there also are various ways to form the sandwich structure 109. For example, each layer of the sandwich structure 109 can also be formed by different deposition steps, or each layer of the sandwich structure 109 can be formed by alternately performing deposition steps, such as alternately performing low-pressure chemical vapor deposition and plasma-enhanced chemical vapor deposition.

In FIG. 1B, the sandwich structure 109 is patterned to form a gate structure 109a. The gate structure 109a comprises a first amorphous silicon layer 104a, a polysilicon layer 106a, and a second amorphous silicon layer 108a, or a first polysilicon layer with a small grain size 104a, a polysilicon layer 106a, and a second polysilicon layer with a small grain size 108a. Because the amorphous silicon layer 108, or the second polysilicon layer with a small grain size 108, has a smooth surface, the scattering of the ultra violet ray can be avoided. The critical dimension can be effectively controlled. Therefore, uniformity of critical dimension can be obtained.

An ion implantation step is performed in order to increase the conductivity of the first amorphous silicon layer 104 (140a), the polysilicon layer 106 (106a), and the second amorphous silicon layer 108 (108a), or the first polysilicon layer with a small grain size 104 (104a), the polysilicon layer 106 (106a), and the second polysilicon layer with a small grain size 108 (108a). The ion implantation step can be performed before or after the step of patterning the sandwich structure 109. The implanted ions can be N-type ions or P-type ions. N-type ions are chosen from the group consisting of $P^+$, $As^+$, $Sb^+$ or the like. P-type ions are chosen from the group consisting of $B^+$, $BF_2, In^+$, or the like.

In FIG. 1C, a thermal step is performed after ion implantation. The thermal step makes ions spread homogeneously. The thermal step can be, for example, a rapid thermal annealing. After the thermal step, the amorphous silicon layers 104a and 108a are crystallized into polysilicon layers 104b and 108b, while the polysilicon layer 106a substantially preserves its original crystal phase. The conductivity of the polysilicon layers 104b and 108b thus is increased after the thermal step. The polysilicon layer 104b has a grain size smaller than the grain size of the polysilicon layer 106a. The polysilicon layer 108b has a grain size smaller than the grain size of the polysilicon layer 106a. A sandwich-structured gate 109b comprising the polysilicon layer 104b, the polysilicon layer 106a, and the polysilicon layer 108b is formed. The present invention solves the channeling effect by providing the polysilicon layer 104b with a small grain size. In comparison with the conventional method, in which the polysilicon layer is made of large grain size, the small crystal grains of the polysilicon layer 104b provide a larger boundary between the polysilicon layer 104b and the gate oxide layer 102. With an increased boundary, ions can be effectively dissipated, and thus their penetrating effect can be significantly reduced.

In summary, the invention has the following advantages:

1. The invention forms a sandwich structure comprising a first amorphous silicon layer, a polysilicon layer, and a second amorphous silicon layer, or a first polysilicon layer with a small grain size, a polysilicon layer, and a second polysilicon layer with a small grain size. Because surface of the uppermost layer of the sandwich structure is smooth, the critical dimension can be preferably controlled and the uniform critical dimension of a gate can be obtained.

2. The invention forms a sandwich structure comprising a first amorphous silicon layer, a polysilicon layer, and a second amorphous silicon layer, or a first polysilicon layer with a small grain size, a polysilicon layer, and a second polysilicon layer with a small grain size. If the sandwich structure comprises the first amorphous silicon layer, the polysilicon layer, and the second amorphous silicon layer, after a thermal step, the sandwich structure transform into a gate structure comprising a polysilicon layer with a small grain size, a polysilicon layer with a large grain size, and a polysilicon layer with a small grain size.

3. In the invention, the gate provides small grains to increase the boundary between the polysilicon layer and the gate oxide layer. With an increased boundary, the boron penetration to gate oxide layer is effectively reduced.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a gate, comprising the steps of:

forming a gate oxide layer on a substrate;

forming a first amorphous silicon layer on the gate oxide layer;

forming a polysilicon layer on the first amorphous silicon layer;

forming a second amorphous silicon layer on the polysilicon layer to form a sandwich structure comprising of the polysilicon layer between the amorphous silicon layers, wherein the second amorphous silicon layer is an uppermost layer of the sandwich structure; and patterning the sandwich structure to form the gate.

2. The method of claim 1, further comprising a step of performing an ion implantation before the step of patterning the sandwich structure.

3. The method of claim 2, wherein ions implanted in the ion implantation step are P-type ions.

4. The method of claim 2, wherein ions implanted in the ion implantation step are N-type ions.

5. The method of claim 2, further comprising performing a thermal step after ion implantation.

6. The method of claim 1, further comprising a step of performing an ion implantation after forming the gate.

7. The method of claim 6, wherein ions implanted in the ion implantation step are P-type ions.

8. The method of claim 6, wherein ions implanted in the ion implantation step are N-type ions.

9. The method of claim 6, further comprising performing a thermal step after ion implantation.

10. The method of claim 1, wherein the step of forming the first amorphous silicon layer includes forming a first amorphous silicon layer having a thickness of about 50 Å to 300 Å.

11. The method of claim 1, wherein the step of forming the polysilicon layer includes forming a polysilicon layer having a thickness of about 500 Å to 3000 Å.

12. The method of claim 1, wherein the step of forming the second amorphous silicon layer includes forming a second amorphous silicon layer having a thickness of about 50 Å to 300 Å.

13. A method of fabricating a gate, comprising the steps of:

forming a gate oxide layer on a substrate;

forming a first doped polysilicon layer on the gate oxide layer;

forming a second doped polysilicon layer on the first doped polysilicon layer; and forming a third doped polysilicon layer over the second polysilicon layer, wherein the second doped polysilicon layer is formed to have a grain size that is larger than a grain size of both the first doped polysilicon layer and the third doped polysilicon layer formed as recited above.

14. A method of fabricating a gate, comprising the steps of:

forming a first amorphous silicon layer on a substrate;

forming a first polysilicon layer on the first amorphous silicon layer;

forming a second amorphous silicon layer on the first polysilicon layer; and transforming the first amorphous silicon layer and the second amorphous silicon layer into the polysilicon layers.

15. The method of claim 14, the step of transforming the first and the second amorphous silicon layer comprises a thermal process.

* * * * *